United States Patent [19]
Ohmori

[11] Patent Number: 5,119,390
[45] Date of Patent: Jun. 2, 1992

[54] ENERGY AMOUNT CONTROLLING DEVICE

[75] Inventor: Taro Ohmori, Yokohama, Japan

[73] Assignee: Canon Kabushiki Kaisha, Tokyo, Japan

[21] Appl. No.: 563,057

[22] Filed: Aug. 6, 1990

[30] Foreign Application Priority Data

Aug. 7, 1989 [JP] Japan .................................. 1-202774

[51] Int. Cl.⁵ .............................................. H01S 3/10
[52] U.S. Cl. ....................................... 372/25; 372/38; 355/53; 355/71
[58] Field of Search ...................... 372/25, 38; 355/53, 355/71

[56] References Cited

U.S. PATENT DOCUMENTS 4,884,101 11/1989 Tanimoto ............................. 355/71
4,970,546 11/1990 Suzuki et al. ........................ 355/71

FOREIGN PATENT DOCUMENTS 2519156 7/1983 France .

OTHER PUBLICATIONS

Yariv, Amnon *Optical Electronics* Section 4.1, Holt, Rinehart and Winston, Inc. N.Y., 1985.

*Primary Examiner*—Georgia Y. Epps
*Attorney, Agent, or Firm*—Fitzpatrick, Cella, Harper & Scinto

[57] ABSTRACT

An irradiation control system includes a radiation energy source for producing radiation energy in the form of pulses; a path defined for the radiation energy, between the radiation energy source and a surface to be irradiated with the radiation energy from the radiation energy source; an energy changing member provided in relation to the path and being effective to change the proportion of the radiation energy, irradiating the surface, to the radiation energy produced by the radiation energy source; a detecting device for detecting the irradiation of the surface with a predetermined amount of radiation energy; a driving device for changing the state of the energy changing member at least during a period from start of irradiation of the surface with the radiation energy to the detection of irradiation of the surface with the predetermined amount of radiation energy through the detecting device; and a control device for controlling the timing of production of radiation energy by the radiation energy source, in relation to the state of the energy changing member.

11 Claims, 6 Drawing Sheets

ENERGY AMOUNT CONTROLLING DEVICE

FIELD OF THE INVENTION AND RELATED ART

This invention relates to an energy amount controlling device for controlling the amount of irradiation of energy to a sensitive member and, more particularly, to an energy amount controlling device suitably usable for exposure amount control in a semiconductor device manufacturing apparatus for illuminating and exposing a reticle or a wafer by use of light from a pulsed laser.

Recent semiconductor electronic circuits are in a trend of further increase in the degree of integration and further miniaturization of the device. Also, with the development of higher resolution lenses, the adaptability of optical lithography is expanding. In such exposure apparatuses for manufacture of semiconductor devices, when a circuit pattern of a mask or reticle is transferred and printed on a wafer surface, the resolvable linewidth of the circuit pattern printed on the wafer surface is proportional to the wavelength of the exposure light used. In consideration thereof, in such lithographic apparatus, a Hg lamp is used as an ultraviolet light source while, on the other hand, an ultra-high pressure Xe-Hg lamp is used as a deep UV light source.

Since, however, a resist material applied to a wafer does not have a high sensitivity to such light, the efficiency of operation is not good.

On the other hand, a special light source, called an "excimer laser" having a high power and an emission wavelength in the deep ultraviolet region, has recently been used in many applications. Since such an excimer laser has a high luminance and monochromaticity and has a short coherence length, it is very effective for use as a light source in an exposure apparatus for manufacture of semiconductor devices.

SUMMARY OF THE INVENTION

When an excimer laser is used as a light source in an illumination optical system of an exposure apparatus and when the amount of energy irradiation of a wafer surface is to be adjusted, it may be considered to control the discharge excitation voltage because the excimer laser is of a discharge excitation type. With such a method, however, if the excitation voltage is too high, the laser or the excitation circuit is damaged. If, on the other hand, the excitation voltage is too low, the laser does not emit a beam. Therefore, it is generally very difficult to adjust the amount of energy irradiation at high precision by controlling the excitation voltage.

Further, an excimer laser is a high-power pulse emission type laser, and the duration of light emission is very short, such as on an order of 10-20 msec. Therefore, it is difficult to control the amount of energy irradiation precisely by controlling the irradiation time.

Also, such a method may be considered wherein an ND filter is used to adjust the amount of energy irradiation. However, still with this method, there is a problem that, in order to introduce a filter into an optical path and to retract the filter out of the optical path during the interval of successive pulses, a large motor has to be used so as to minimize the rise time of the motor of a moving mechanism for moving the filter.

In consideration of these problems, it is an object of the present invention to provide an energy amount controlling device of a simple structure, by which the amount of energy irradiation can be controlled to a proper level in a stable state and for a long period of time. Particularly, the present invention aims at providing an energy amount controlling device suitably usable for exposure amount control in an exposure apparatus for transferring, by projection, a circuit pattern onto a photosensitive material surface such as a photoresist, for example, on a wafer surface by use of pulsed light.

These and other objects, features and advantages of the present invention will become more apparent upon consideration of the following description of the preferred embodiments of the present invention taken in conjunction with the accompanying drawings.

DESCRIPTION OF THE PREFERRED EMBODIMENTS

Figure 1:
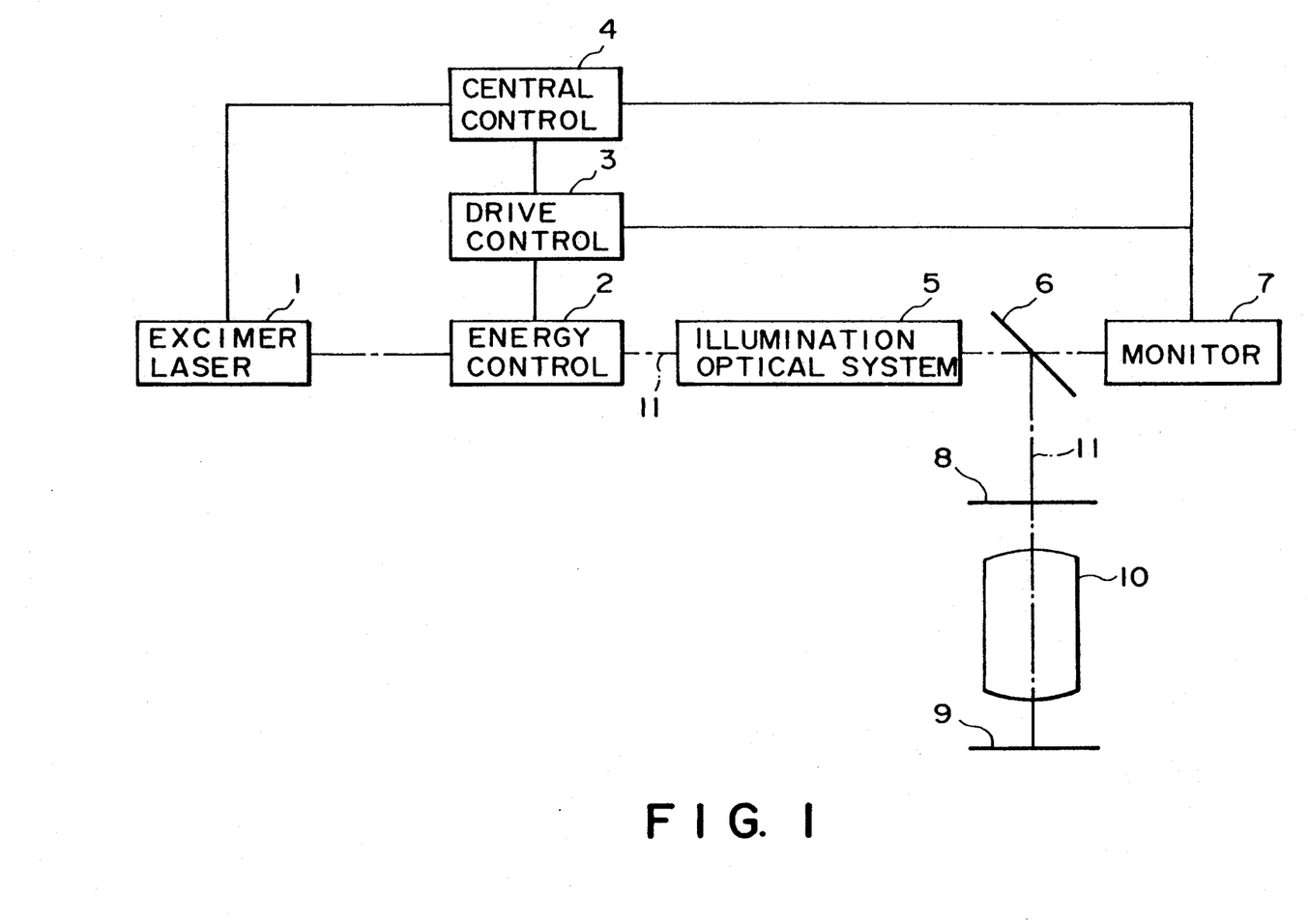
FIG. 1 a diagrammatic view showing a general structure of an exposure apparatus into which an energy amount controlling device according to one embodiment of the present invention is incorporated.
Figure 2:
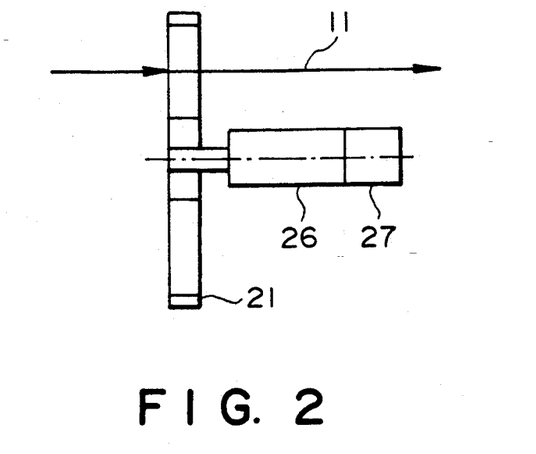
FIGS. 2 and 3 are a side view and a front view, respectively, schematically showing details of an energy amount controlling means according to a first embodiment of the present invention.
Figure 3:
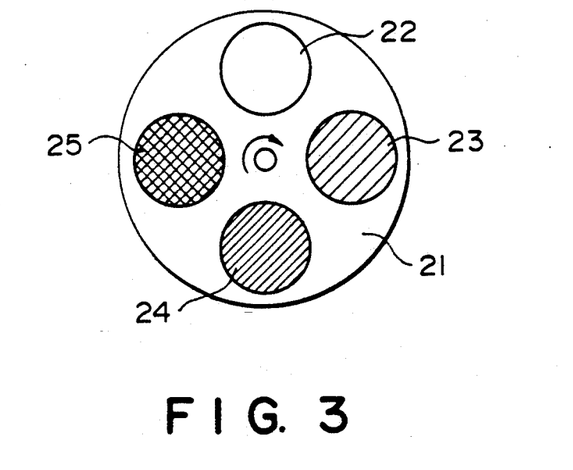

FIGS. 1, 2 and 3 are schematic representations, illustrating a first embodiment of the present invention. In FIG. 1, denoted at 1 is an excimer laser which is a pulsed laser having a good directivity; at 2 is an energy amount controlling means; at 3 is a drive controlling means for driving the energy amount controlling means 2; at 4 is a central controlling means for controlling the excimer laser 1 and the drive controlling means 3, for control of the energy amount; at 5 is an illumination optical system comprising a first lens group; at 6 is a reflection mirror adapted to transmit a portion of light; at 7 is a monitoring means including a photoreceptor for measuring the quantity of light (i.e., the energy amount) partially transmitted through the reflection mirror 6; at 8 is a reticle; at 9 is a plane of projection on which a wafer is to be held; at 10 is a projection optical system comprising a second lens group for projecting a pattern of the reticle 8 on the plane 9; and at 11 is an optical axis for the light path of the exposure light, emitted by the excimer laser 1, up to the plane 9.

FIG. 2 illustrates details of the energy amount controlling means 2 of FIG. 1. In FIG. 2, denoted at 21 is a rotary plate disposed across the optical axis 11; at 26 is a motor for rotating the rotary plate 21 about an axis substantially parallel to the optical axis 11; at 27 is an encoder for detecting the rotational speed and position (angle of rotation) of the motor 26. Each of the motor 26 and the encoder 27 are communicated with the drive controlling means 3.

FIG. 3 illustrates the energy amount controlling means 2 of FIG. 2, as viewed from the direction of the optical axis 11 (i.e. a horizontal direction in the sheet of FIG. 2). In FIG. 3, denoted at 22 is a through-hole formed through the rotary plate 21; at 23 is an ND filter mounted to another through-hole formed in the rotary plate 21 and being adapted to transmit three quarters ($\frac{3}{4}$) of a received energy amount (exposure radiation energy from the excimer laser 1); at 24 is another ND filter mounted to another through-hole formed in the rotary plate 21 and being adapted to transmit a half ($\frac{1}{2}$) of a received energy amount; and at 25 is a further ND filter mounted to a further through-hole formed in the rotary plate 21 and being adapted to transmit a quarter ($\frac{1}{4}$) of a received energy amount.

The through-hole 22 and three ND filters 23-25 are disposed in a quadrant relationship (equiangular relation with 90 degrees) with respect to the center of rotation of the rotary plate 21. Each of the through-hole 22 and three ND filters 23-25 is arranged such that, with the rotation of the rotary plate 21, the center of the through-hole or filter crosses the center of the optical axis 11. Also, the corresponding relationship of each of the through-hole 22 and the ND filters 23-25 with an associated rotational angle signal from the encoder, is memorized into the central controlling means 4 beforehand.

In the structure described above, the motor 26 rotates at a predetermined constant speed in response to a drive instruction signal from the drive controlling means 3, based on a rotating speed feedback signal from the encoder 27. With the rotation of the motor 26, the rotary plate 21 of the energy amount controlling means 2 rotates. When the surface 9 is going to be exposed with the radiation by a predetermined correct exposure amount (hereinafter "exposure energy amount"), the central controlling means 4 detects a signal of rotation angle of the rotary plate 21 from the encoder 27, through the drive controlling means 3, and then supplies an instruction signal to the excimer laser 1 so that it provides pulse emission at the timing at which the through-hole 22 is first aligned with the optical axis 11. On this occasion, the light emission timing of the excimer laser 1 is synchronized with the rotation of the motor 26, such that the light pulses emitted therefrom always pass through the through-hole 22. The monitoring means 7 operates to measure the pulse energy amount (an amount corresponding to the actual amount of exposure of the wafer) of each pulse emitted by the excimer laser 1, and also to integrate the measured values. When a required integrated value, namely, a required exposure energy amount, is reached, the central controlling means 4 stops the light emission of the excimer laser 1. These discriminations are executed in the central controlling means 4. Also, the integration of the pulse energy amounts may be effected in the central controlling means 4.

It is to be noted here that, in such operation, the exposure energy amount is controlled only by the control of the number of exposure pulses. For example, between a hundred (100) pulses and a hundred and one (101) pulses, there is a difference of 1%, but using only such pulse number control, it is not possible to provide an exposure corresponding to one hundred point five (100.5) pulses.

In the device of the present embodiment, in consideration thereof, at a moment at which it is discriminated that the required exposure energy amount can be reached by the application of an additional pulse energy amount not greater than one pulse energy, by using the monitoring means 7 and the central controlling means 4 the necessary exposure energy amount to be added is calculated. Also, such one of the pulse energy amounts corresponding to "zero pulse", "$\frac{1}{4}$ pulse", "$\frac{1}{2}$ pulse", "$\frac{3}{4}$ pulse" and "one pulse", that is closest to the exposure energy amount to be added is selected amount. If, for example, the selected is the "zero pulse", the emission of an additional pulse (last pulse) is ceased. If, on the other hand, the selected amount is the "$\frac{1}{4}$ pulse", the central controlling means 4 supplies an instruction signal to the excimer laser 1 on the basis of a rotation angle signal from the encoder 27, so as to cause the excimer laser to emit one pulse (last pulse) at the timing at which the center of the ND filter 25 mounted to the rotary plate 21 crosses the optical axis 11. Similarly, if the selected amount is the "$\frac{1}{2}$ pulse", on the basis of the rotation angle signal from the encoder 27 the central controlling means 4 supplies an instruction signal to the excimer laser 1 to cause the same to emit a last one pulse at the timing at which the center of the ND filter 24 mounted to the rotary plate 21 crosses the optical axis 11. Also, if the selected amount is the "$\frac{3}{4}$ pulse", on the basis of the rotation angle signal from the encoder 27 the central controlling means 4 supplies an instruction signal to the excimer laser 1 to cause the same to emit a last one pulse at the timing at which the center of the ND filter 23 mounted to the rotary plate 21 crosses the optical axis 11. If the selected amount is the "one pulse", on the basis of the rotation angle signal from the encoder 27 the central controlling means 4 supplies an instruction signal to the excimer laser 1 so as to cause the same to emit a last one pulse at the timing at which the center of the through-hole 22 formed in the rotary plate 21 crosses the optical axis 11. In this manner, at a unit of an energy amount corresponding to a quarter pulse, the exposure energy amount can be controlled, without specifically adjusting the energy amount of pulsed light emitted by the excimer laser 1.

Here, if the total pulse number emitted during the exposure operation as described above is denoted by n, since the rotary plate 21 is rotated at a constant speed, the time interval between successive pulses, from the first pulse to the "n−1"-th pulse, is equal to the time for one complete revolution of the rotary plate 21 and is constant. If such a time is denoted by t, then the time interval between the "n−1"-th pulse and the n-th pulse is a multiple of t/4 by an integer.

While in the foregoing embodiment, the rotary plate 21 is rotated at a constant speed, the rotating speed of the motor 26 may be controlled to be accelerated/decelerated by the driving means 3 or some versatility may be provided to a variation in the rotating speed. On that occasion, in a similar manner as described hereinbefore, an instruction signal may be supplied from the central controlling means 4 to the excimer laser 1 so that th pulse emission is synchronized with the timing of passage, across the center of the optical axis 11, of the center of each of the through-hole 22 and the ND filters 23-25, with the rotation of the rotary plate 21.

Also, while in the foregoing embodiment one through-hole 22 is provided during one complete revolution of the rotary plate 21, a plurality of through-holes 22 may be provided in the rotary plate 21. On this occasion, since it is not necessary for the rotary plate 21 to effect one complete revolution during the interval of light emission of the excimer laser 1 when the pulsed light from the excimer laser 1 is to be directly projected to the wafer, it is possible to decrease the rotating speed of the rotary plate 21.

Further, while in the foregoing embodiment the energy amount correction is effected by the last pulse emission in one exposure operation, the energy amount can be corrected by emission of pulse pulses, not limited to the last pulse. For example, when correction is effected by using a combination of a through-hole 22 and three ND filters having different transmission factors, namely, a ½ transmission ND filter, a ¼ transmission ND filter and a ⅛ transmission ND filter, for example, it is possible to control the exposure energy amount by a resolution of energy amount corresponding to 1/16 pulse.

The operation of such an example will be explained in greater detail by reference to the flow chart of FIG. 10. It is to be noted here that, in this case, in FIG. 3 the filter 23 is the "½ transmission" ND filter, the filter 24 is the "¼ transmission" ND filter and the filter 25 is the "⅛ transmission" ND filter.

Figures 10, 10B:
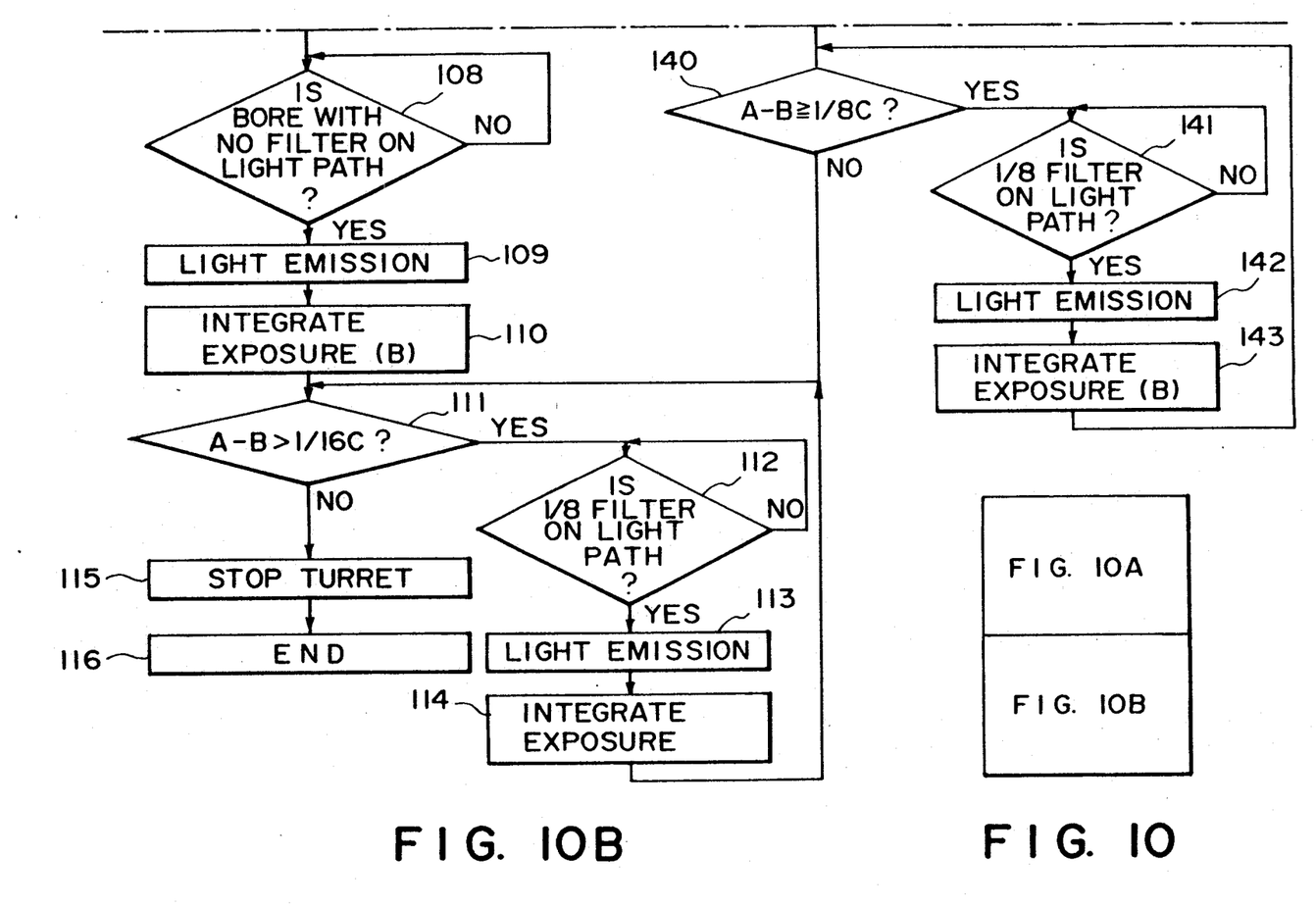
FIGS. 10a, 10b are a flow chart, for explaining the operation of the first embodiment.
Figure 10A:
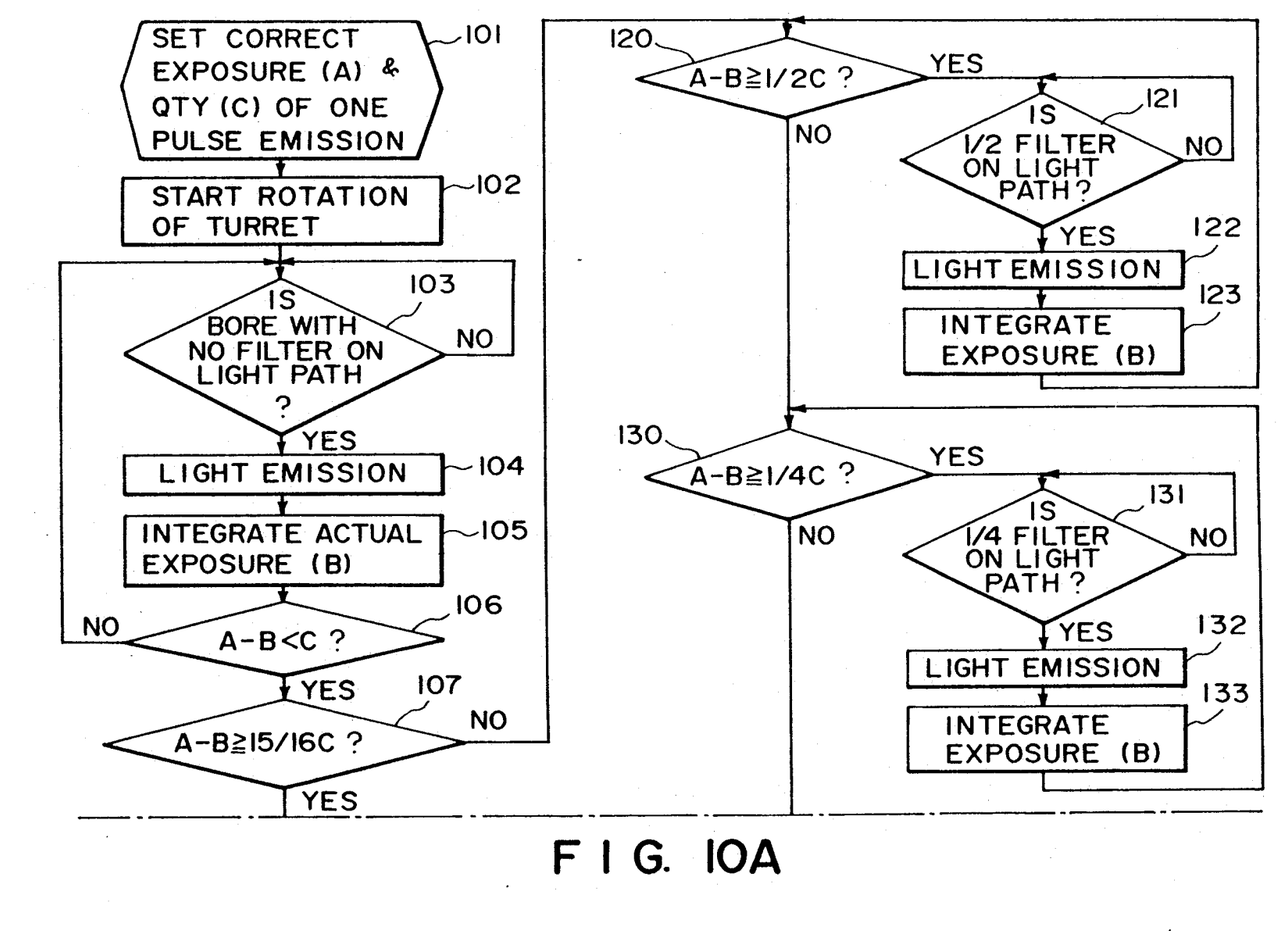

In the flow chart of FIG. 10, at step 101, the correct exposure amount A necessary for printing the pattern of the reticle 8 to a wafer, held on the plane 9 of projection, is set. Additionally, the amount of light emission per one pulse to be emitted by the excimer laser 1, namely, the amount C with which the wafer is exposed by one emitted pulse, is set. The correct exposure amount A and the light amount C by one pulse are set to the central controlling means 4. In response to the setting of the one pulse light amount C, the central controlling means 4 produces a light emission adjustment instructing signal to the excimer laser 1 so that the light amount to be provided by one emission of the excimer laser 1 becomes equal to the set amount.

When, after this, an exposure start instruction is supplied, the central controlling means 4 starts the rotation of the rotary plate 21 with the motor 26 through the drive controlling means 3 (step 102). At the initial stage just after start of the exposure, it is desirable to use, for the exposure, the through pulses of light from the excimer laser 1 without attenuating them by the filter 23, 24 or 25, with respect to the throughput, for example. Accordingly, at step 103, discrimination is made on the basis of the rotation angle signal from the encoder 27 so as to assure that, when the center of the through-hole 22 of the rotary plate 21 is aligned with the optical axis 11, namely, when the through-hole 21 is placed within the path of the exposure light, the sequence goes to step 104. As the alignment of the center of the through-hole 22 with the optical axis 11 is discriminated at step 103, the emission of the excimer laser 1 is executed (step 104). The actual exposure amount by this one pulse is measured by the monitoring means 7, and the measured value is integrated at step 105 to obtain an actual exposure amount B, provided by the already executed exposure or exposures. Thereafter, at step 106, discrimination is made as to whether the difference between the set correct exposure amount A and the actual exposure amount B (hereinafter, such difference will be referred to as "the exposure amount to be complemented") is smaller than the one pulse light amount, namely, the one pulse exposure amount C. If not smaller, the sequence goes back to step 103 and the above-described operation is repeated.

If at step 106 the exposure amount to be complemented (which is equal to A−B) is discriminated as being smaller than the one pulse exposure amount C, the sequence goes to step 107 whereat discrimination is made as to whether the exposure amount to be complemented (=A−B) is not less than fifteen-sixteenth (15/16) of the one pulse exposure amount C. This discrimination is made because, in the present embodiment, the corrective exposure using a filter can only provide the exposure control at a unit of one-eighth (⅛) of the one pulse exposure amount C and, if the exposure amount to be complemented (=A−B) is not less than 15/16 of the one pulse exposure amount C, a better result is obtainable by executing again the exposure through one pulse from the through-hole 22, rather than by executing the corrective exposure using any one of the filters 23–25. In other words, on this occasion, the execution of additional one-pulse exposure through the through-hole 22 is effective to make smaller the exposure amount to be complemented (=A−B), which finally remains at the time of completion of the exposure operation.

If at step 107 the exposure amount to be complemented (=A−B) is discriminated as being not less than 15/16 of the one pulse exposure amount C, the sequence goes to step 108 whereat discrimination is made as to whether the through-hole 22 is aligned with the path of exposure light. When they are aligned, at step 109 the excimer laser 1 is energized to provide emission of the set light amount C. Thereafter, at step 110, the measured value of the monitoring means 7 at this time is integrated as the actual exposure amount B, and the sequence goes to step 111. At step 111, discrimination is made as to whether the exposure amount to be complemented (=A−B) is larger than one-sixteenth (1/16) of the one-pulse exposure amount C. If it is not larger than 1/16 of the one pulse exposure amount C, at step 115 the rotation of the rotary plate 21 by the motor 26 is stopped and, thereafter, at step 116 the exposure operation is finished. This is for the reason that, if the exposure amount to be complemented (=A−B) is not larger than 1/16 of the one-pulse exposure amount C, the final exposure amount to be complemented (=A−B) which remains at the time of completion of the exposure can be made smaller by finishing the exposure without executing additional exposure, rather than by adding an exposure of an amount corresponding to ⅛ of the one-pulse exposure amount C with the use of the filter 25.

On the other hand, if at step 111 the exposure amount to be complemented (=A−B) is discriminated as being larger than 1/16 of the one-pulse exposure amount C, the sequence goes to step 112 for executing additional exposure by using the "⅛ transmission" ND filter 25. As the alignment of the filter 28 with the path of the exposure light is discriminated on the basis of the rotation angle signal from the encoder 27, at step 113 the excimer laser 1 emits light, and the measured value of the monitoring means 7 at this time is integrated at step 114 to the actual exposure amount B. Thereafter, the sequence goes back to step 111. The operational sequence of the steps 112–114 is repeated until at step 111 the exposure amount to be complemented (=A−B) is discriminated as being not greater than 1/16 of the one-pulse exposure amount C.

If at step 107 the exposure amount to be complemented (=A−B) is discriminated as being smaller than 15/16 of the one-pulse exposure amount C, the sequence goes to step 120 whereat the corrective exposure sequence using any one of the filters 23-25 is executed. In such a corrective exposure sequence, for efficiency of the correction, the priority is determined in with respect to the order of use of the filters 23-25. Namely, the order is the exposure using the "$\frac{1}{2}$ transmission" ND filter 23, the exposure using the "$\frac{1}{4}$ transmission" ND filter 24 and the exposure using the "$\frac{1}{8}$ transmission" ND filter 25.

In the corrective exposure sequence, first at step 120 discrimination is made as to whether the exposure amount to be complemented ($=A-B$) is not smaller than one half ($\frac{1}{2}$) of the one-pulse exposure amount C. If not smaller, the sequence goes to step 121 for execution of exposure using the "$\frac{1}{2}$ transmission" ND filter 23. Here, as the alignment of the filter 23 with the path of the exposure light is discriminated on the basis of the rotation angle signal from the encoder 23, at step 122 the excimer laser 1 emits light. The measured value of the monitoring means 7 at this time is integrated at step 123 to the actual exposure amount B. Thereafter, the sequence goes back to step 120, and the above-described operation is repeated until at step 120 the exposure amount to be complemented ($=A-B$) is discriminated as being smaller than a half of the one-pulse exposure amount C.

On the other hand, if at step 120 the exposure amount to be complemented ($=A-B$) is discriminated as being smaller than a half of the one-pulse exposure amount C, the sequence goes to step 130 whereat discrimination is made a to whether the exposure amount to be complemented ($=A-B$) is not smaller than a quarter ($\frac{1}{4}$) of the one-pulse exposure amount C. If not smaller, the sequence goes to step 131 for execution of exposure using the "$\frac{1}{4}$ transmission" ND filter 24. Here, as the alignment of the filter 24 with the path of exposure light is discriminated on the basis of the rotation angle signal from the encoder 27, at step 132 the excimer laser emits light. The measured value of the monitoring means 7 at this time is integrated to the actual exposure amount B (step 133). Thereafter, the sequence goes back to step 130, and the above-described operation is repeated until at step 130 the exposure amount to be complemented ($=A-B$) is discriminated as being smaller than $\frac{1}{4}$ of the one-pulse exposure amount C.

On the other hand, if at step 130 the exposure amount to be complemented ($=A-B$) is discriminated as being smaller than $\frac{1}{4}$ of the one-pulse exposure amount C, the sequence goes to step 140 whereat discrimination is made as to whether the exposure amount to be complemented ($=A-B$) is not larger than one-eighth ($\frac{1}{8}$) of the one-pulse exposure amount C. If not larger, the sequence goes to step 141 for execution of the exposure by using the "$\frac{1}{8}$ transmission" ND filter 25. Here, as the alignment of the filter 25 with the path of exposure light is discriminated on the basis of the rotation angle signal from the encoder 27, at step 142 the excimer laser 1 emits light. The measured value of the monitoring means 7 at this time is integrated to the actuation exposure amount B at step 143. Thereafter, the sequence goes back to step 140; and the above-described operation is repeated until in the step 140 the exposure amount to be complemented ($=A-B$) is discriminated as being smaller than $\frac{1}{8}$ of the one-pulse exposure amount C.

If at step 140 the exposure amount to be complemented ($=A-B$) is discriminated as being smaller than $\frac{1}{8}$ of the one-pulse exposure amount C, the corrective exposure sequence of the steps 120-143 is finished, and the sequence goes to step 111, whereby the final corrective exposure sequence comprising step 111 and steps following it, is executed. Such final corrective exposure is executed in the manner as described hereinbefore, and, when the exposure amount to be complemented ($=A-B$) becomes equal to or less than 1/16 of the one-pulse exposure amount C, the rotation of the rotary plate 21 by the motor 26 is stopped (step 115) and the exposure operation is finished. When the exposure apparatus shown in FIG. 1 is of a stepper (step-and-repeat type exposure apparatus), it is not always necessary to stop the rotation of the rotary plate 21 each time the exposure of one of different shot areas of the wafer is completed. For example, the rotation may be continued until the exposures of all the shot areas on the wafer are completed. Further, the rotary plate 21 may be controlled so as to rotate continuously.

In the foregoing embodiments, three ND filters having different transmission factors are used. However, the number is not limited to three. In accordance with the number of the stages of the corrective exposure, only one type may be used or different types may be used. Also, plural ND filters having the same transmission factor may be used.

Further, an ND filter used in the preceding embodiments may be replaced by a half mirror for reflecting a desired energy amount.

In accordance with the first embodiment described hereinbefore, in an exposure apparatus using an excimer laser, optimum energy amount control is ensured only by a simple system wherein a rotary plate having at least one through-hole and at least one ND filter is rotated continuously during the exposure operation so that the through-hole and the ND filter successively come into and go out of the light path and wherein the emission of the excimer laser and the position of the rotary plate are controlled in a timed relationship.

Next, a second embodiment of the present invention will be explained. This embodiment is an example wherein the energy amount controlling means 2 of the structure shown in FIG. 1 is replaced by that illustrated in FIG. 4.

Figure 4:
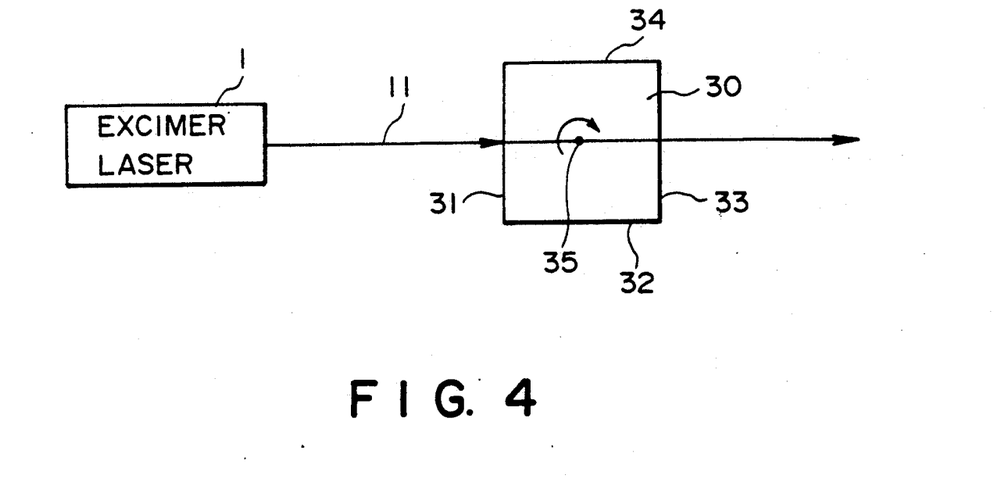
FIG. 4 is a schematic view, showing details of an energy amount controlling means according to a second embodiment of the present invention.

In FIG. 4, denoted at 30 is an optical member for transmitting light emitted from an excimer laser 1, and this optical member 30 is a cube having a rectangular cross-sectional shape. Denoted at 31 is one surface of the cube 30 and denoted at 33 is another surface which is at the opposite side of the surface 31 and is parallel to the surface 31. Denoted at 32 is another surface of the cube 30 which is perpendicular to the surface 31. Denoted at 34 is another surface of the cube which is at the opposite side of the surface 32 and is parallel to the surface 32. Denoted at 35 is the center of rotation (the rotation about an axis extending in a direction perpendicular to the sheet of the drawing) which is at the center of the section of the cube 30. The cube 30 is rotated about the rotational center 35 by an actuator and a drive controlling means not shown. The excimer laser 1 is disposed so that the optical axis 11 of the light emitted from the excimer laser 1 extends perpendicularly to the axis of the rotational center 35.

Here, the light incident perpendicularly on the surface 31 is transmitted through the cube 30 and emanates from the surface 33 perpendicularly, with an energy amount substantially 100% of an inputted energy amount. Similarly, the light incident perpendicularly on the surface 33 is transmitted through the cube 30 and emanates from the surface 31 perpendicularly with an energy amount substantially 100% of an inputted energy amount. On the other hand, each of the surfaces 32 and 34 is equipped with a semi-transparent film, such that light incident perpendicularly on the surface 32 is transmitted through the cube 30 and emanates from the surface 34 perpendicularly but with an energy amount of a half of an inputted energy amount. Similarly, light perpendicularly incident on the surface 34 is transmitted through the cube 30 and emanates from the surface 32 perpendicularly but with an energy amount equal to a half of an inputted energy amount.

When, in the structure described above, exposure of the surface 9 to be exposed, is going to be done with a predetermined exposure energy amount, after starting the rotation of the cube 30 about the axis 35 the central controlling means 4 operates to provide a timed relationship such that the excimer laser 1 emits light at the timing at which the optical axis 11 of the light emitted by the excimer laser 1 is inputted perpendicularly to each of the surfaces 31–34. In this case, by appropriately combining the four surfaces with the number of pulses of the laser light to be inputted to the appropriate surfaces, it is possible to determine the total exposure energy amount at a unit of a half ($\frac{1}{2}$) of the energy amount per one pulse of the excimer laser beam. Namely, it is possible to execute the energy amount control at a unit energy amount corresponding to a half of the energy amount provided by one pulse of excimer laser 1. While in this embodiment a cube 30 of rectangular cross-sectional shape is used, any other polygonal surface member may be used. An example is disclosed in the next embodiment.

Figure 5:
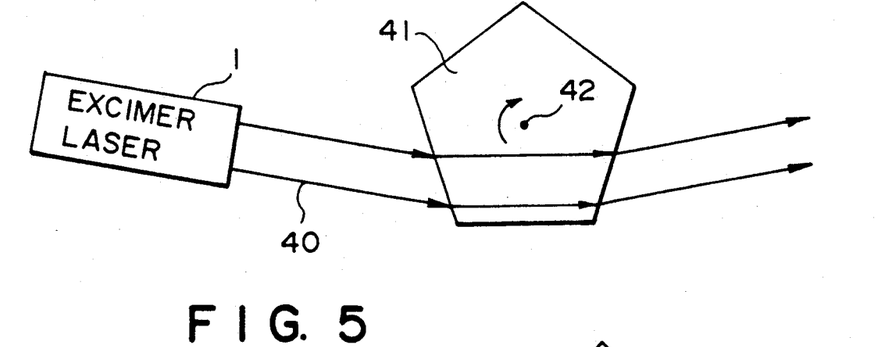
FIG. 5 is a schematic view, illustrating details of an energy amount controlling means according to a third embodiment of the present invention.

FIG. 5 shows a third embodiment of the present invention. This embodiment is an example wherein the cube 30 of rectangular cross-sectional shape of the second embodiment is replaced by one having a pentagonal cross-sectional shape, and FIG. 5 illustrates details of the energy amount controlling means 2 of FIG. 1.

In FIG. 5, denoted at 40 is a flux of light emitted by a excimer laser 1; denoted at 41 is an optical member having a regular pentagonal cross-sectional shape and is adapted to transmit the excimer laser light 40; and denoted at 42 is the center of rotation of the optical member 41, which is placed at the gravity center of the pentagonal shape. The optical member 41 is rotated continuously about the axis 42 during the exposure operation.

In the structure described above, the excimer laser 1 is controlled in such timed relationship that it emits light only at the five points during one revolution of the optical member 41, constantly providing the same path for the light 40. This assures that the light 40 emanates constantly along the same path. Further, the fact that the light emission is effected only at the five positions in one complete revolution of the optical member 41, means that five different optical paths are defined within the optical member 41. Here, by treating the five surfaces, through which light enters into and goes out of the optical member 41, so as to form appropriate semi-transparent films on these five surfaces, five different transmission factors can be provided to the five light paths. By predetermining the respective transmission factors and the five positions in one complete revolution of the optical member 41 and by computing, through the central controlling means 4, the number of light emissions and a corresponding one of the five points at which the light emission is to be effected, it is possible to execute the pulse energy control at a unit not greater than the energy amount of one pulse of the excimer laser 1.

Figure 6:
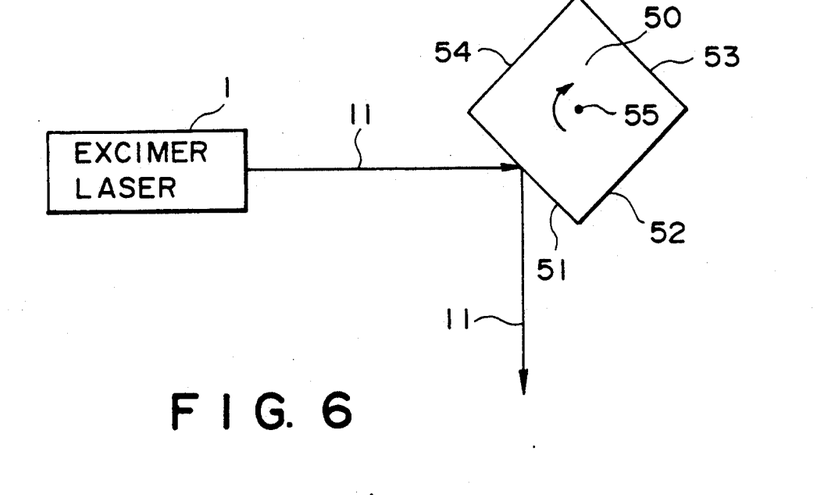
FIG. 6 is a schematic view, illustrating details of an energy amount controlling means according to a fourth embodiment of the present invention.

FIG. 6 shows a fourth embodiment of the present invention. This embodiment is an example wherein reflection light is used, as compared with the transmission light used in the second embodiment, and FIG. 6 illustrates details of the energy amount controlling means 2 of FIG. 1.

In FIG. 6, denoted at 50 is an optical member for reflecting light emitted by an excimer laser 1, and the optical member is a cube having a square cross-sectional shape. Denoted at 51 is one surface of the cube 50, and denoted at 53 is another surface which is at the opposite side of the surface 51 and is parallel to the surface 51. Denoted at 52 is another surface of the cube 50 which is perpendicular to the surface 51. Denoted at 54 is another surface which is at the opposite side of the surface 52 and is parallel to the surface 52. Denoted at 55 is the center of rotation of the cube 50 which is at the center of the cross-section. The cube 50 is continuously rotated about the rotational center 55, at least during the exposure period, by an actuator and a drive controlling means, not shown.

Here, each of the surfaces 51 and 53 provides a total reflection mirror for reflecting light of 100% to a received energy amount. The surface 52 provides a half mirror for reflecting light of 50% to a received energy amount. The surface 54 provides a half mirror for reflecting light of 25% to a received energy amount.

In the structure described above, when the surface 9 is going to be exposed with a predetermined exposure energy amount, the central controlling means 4 successively energize the excimer laser 1 to cause successive light emission, in synchronism with the timing at which the optical axis 11 of the light emitted by the excimer laser 1 defines an angle of 45 degrees to the surface 51 and to the surface 53 of the rotating cube 50, which are the total reflection surface, respectively. The inputted light is deflected by 90 degrees by the surface 51 or 53 and is inputted to the illumination optical system 5 shown in FIG. 1. Similarly to the first embodiment, the exposure amount to be complemented is calculated by using the monitoring means 7 and the central controlling means 4 and, when it becomes equal to not greater than the energy by one pulse, the successive light emission is stopped. Also, such one of the energy amounts corresponding to the "zero pulse", "quarter ($\frac{1}{4}$) pulse", "half ($\frac{1}{2}$) pulse", "three-fourths ($\frac{3}{4}$) pulse" and "one pulse", which is closest to the exposure energy amount to be added, is selected. If the selected amount is the "zero pulse", the emission of an additional or last pulse is ceased. If the selected amount is the "$\frac{1}{4}$ pulse", one pulse is emitted in synchronism with the timing at which the surface 54 of the rotating cube 50 comes to the 45 degrees position of the optical axis 11. If the selected amount is the "$\frac{1}{2}$ pulse", one pulse is emitted in synchronism with the timing at which the surface 52 comes to the 45 degrees position with the optical axis 11. If the selected amount is the "$\frac{3}{4}$ pulse", one pulse is emitted in synchronism with the timing at which the surface 52 comes to the 45 degrees position with the optical axis 11 and, additionally, one pulse is emitted in synchronism with the timing at which the surface 54 comes to the 45 degrees position with the optical axis 11. In this manner, the exposure energy amount is controlled.

In this embodiment, as described, in an exposure apparatus using an excimer laser, the energy amount control is executed by providing plural half mirrors having different reflection factors at the optical path, by introducing and extracting them into and out of the optical path and by providing a timed relationship between the positions of these half mirrors and the emission of the excimer laser.

Figure 7:
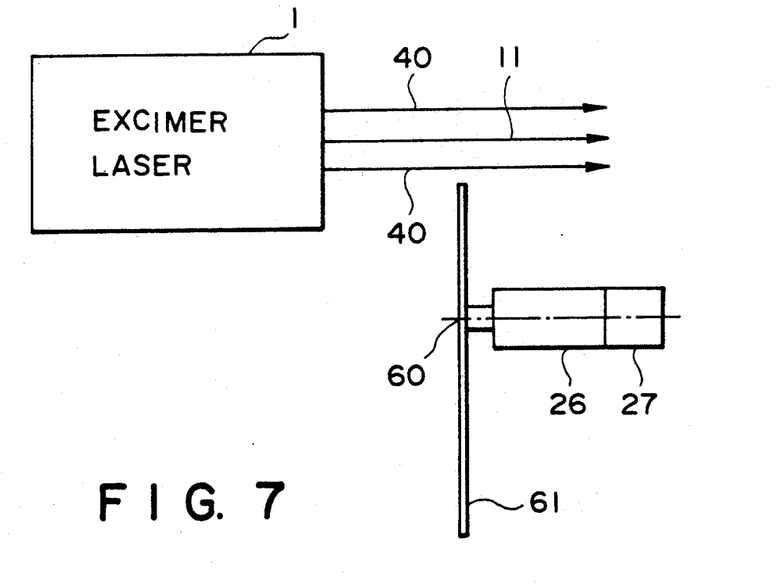
FIGS. 7 and 8 are schematic views, respectively, illustrating details of an energy amount controlling means according to a fifth embodiment of the present invention.
Figure 8:
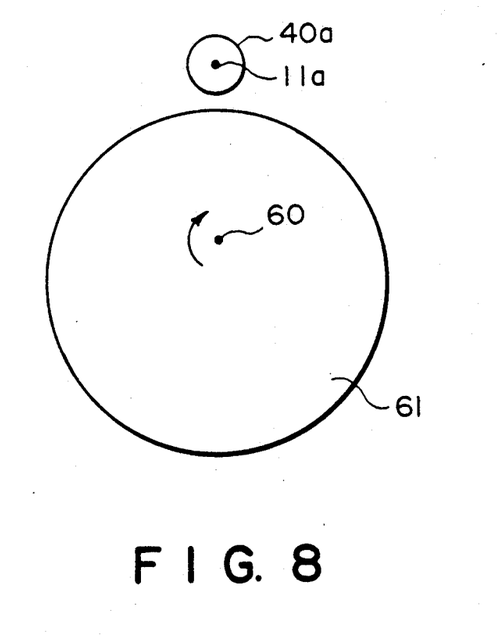

FIGS. 7 and 8 show a fifth embodiment of the present invention, and illustrate details of the energy amount controlling means 2 of FIG. 1. FIG. 8 is a side view of the energy amount controlling means 2, as viewed in the direction of the optical axis 11 in FIG. 7.

In FIGS. 7 and 8, denoted at 11a is the cross-section of the optical axis 11, and denoted at 40a is the cross-section of the outermost peripheral part of the light 40. Denoted at 61 is a rotary plate having a first position for completely blocking the light 40 and a second position not blocking any portion of the light 40. The rotary plate 61 has a function of such an aperture stop by which, during rotation thereof, the amount of light interception can be changed infinitely. Reference numeral 60 denotes the center of rotation of the rotary plate 61.

In the structure described above, the rotary plate 60 is rotated continuously during the exposure period, by the motor 26. The central controlling means 4 detects the position of the rotary plate 61, by using the encoder 27 and the drive controlling means 3. Here, when the central controlling means 4 discriminates a start of exposure of the surface 9 with a predetermined exposure energy amount, it detects the position of the rotary plate 61 by using the encoder 27 and the drive controlling means 3, and supplies an instruction signal to the excimer laser 1 to cause the same to emit pulses successively as the rotary plate 60 is at the position not blocking the passage of the light 40 at all. Then, the energy amount is measured by the monitoring means 7 and, at a moment at which the necessary energy amount can be reached by the application of additional exposure energy not greater than the energy of one pulse, the successive light emission is stopped and, by using the monitoring means 7 and the central controlling means 4, the amount of insufficiency in the exposure energy amount is calculated. Then, the central controlling means 4 supplies an instruction to the excimer laser 1 so as to cause the same to emit one corrective pulse at such a position of the rotary plate 61 at which an energy amount corresponding to the calculated insufficiency in the exposure energy can pass through the energy controlling means. In this manner, with the synchronization of the rotary plate 61 and the emission of the excimer laser 1, the energy amount can be controlled.

Figure 9:
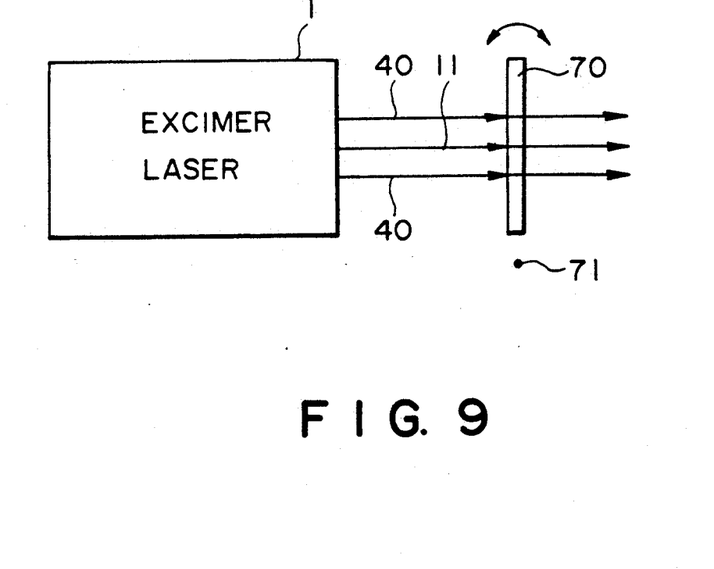
FIG. 9 is a schematic view, illustrating details of an energy amount controlling means according to a sixth embodiment of the present invention.

FIG. 9 shows a sixth embodiment of the present invention, and illustrates details of the energy amount controlling means 2 of FIG. 1.

In FIG. 9, denoted at 70 is an interference filter having such characteristics that the amount of radiation energy passed therethrough is changeable with the angle of incidence of the light thereupon, and denoted at 71 is the center of rotation about which the interference filter moves. This center of rotation is defined by a rectilinear axis extending perpendicularly to the sheet of the drawing. By means of an actuator, not shown, the interference filter 70 is rotated clockwise and counterclockwise about the rotational center 71, within a predetermined angular range. Also, the interference filter 70 has a sufficient size so that it does not fail to receive the light 40 within the range of the reciprocating rotary motion. Further, the angle of the interference filter 70 with respect to the optical axis 11 is monitored continuously, by means of a sensor (not shown).

In the structure described above, the interference filter 70 is continuously rotationally moved clockwise and counterclockwise, during the exposure period. When the central controlling means 4 discriminates the start of exposure of the surface 9 with a predetermined energy amount, the central controlling means 4 detects the position of the interference filter 70 by using a sensor, not shown, and supplies an instruction to the excimer laser 1 so as to cause the same to emit pulses successively, at the timing at which maximum energy amount can be transmitted.

The energy amounts of these pulses are measured and integrated by the monitoring means 7 and, at a moment during the exposure period at which the necessary energy amount can be reached by the application of an additional exposure energy not larger than the energy of one pulse, the light emission is stopped temporarily. Then, by using the monitoring means 7 and the central controlling means 4, the quantity of insufficiency in the energy amount is calculated. Then, the central controlling means 4 supplies an instruction to the excimer laser 1 to cause the same to emit a last one pulse at such angular position of the interference filter 70 at which an energy amount corresponding to the insufficiency in the energy amount can pass therethrough.

The correction is not limited to use of the last one pulse. Since the monitoring means 7 continuously measures the exposure amount, the correction may be made by using plural successive pulses including the last one pulse, to thereby attain the total energy amount required. In such case, the range of reciprocal rotary motion of the interference filter 70 may be reduced, such that the filter can provide a large transmission factor even when the transmitted energy amount is decreased to a minimum. Namely, in order to reduce the energy amount transmitted through the interference filter 70 close to zero, a large angular change has to be made. On that occasion, in order to prevent failure of reception of the light 40 by the interference filter 70, the size of the interference filter has to be made large. Further, in order to decrease the total exposure time, it is necessary to shorten the interval of light emission of the excimer laser 1, and this necessitates increasing the speed of reciprocal rotary motion of the interference filter.

A plurality of interference filters may be provided in the optical path. By providing a timed relationship of the reciprocal rotary motions of these filters, the passage of light through plural interference filters can produce large attenuation, even if the amount of reciprocal rotary motion of each filter is small and thus the decrease in the transmitted energy amount per one filter is small. In accordance with the present embodiment, as described, the energy amount control is executed with a simple structure wherein at least one interference filter rotatable clockwise and counterclockwise is provided in the optical path and the angular position of the interference filter is in a timed relationship with the emission of the excimer laser. The interference filter may be of a reflection type.

While the foregoing description has been made of six embodiments, these embodiments may be used in combination. Further, although it is difficult to largely change the output energy of an excimer laser by controlling the excitation voltage thereof, it is not impossible to change it slightly. Therefore, by changing the output energy of an excimer laser in combination with the present embodiment, a further efficient energy amount control is attainable.

In accordance with the present invention, as described hereinbefore, an energy amount controlling device of simple structure is provided, by which the amount of energy irradiation can be controlled to a proper level constantly in a stable state and for a long period of time. Particularly, the energy amount controlling device of the present invention is suitably usable for projection exposure of a circuit pattern to a photosensitive material surface such as a photoresist on a wafer surface.

While the invention has been described with reference to the structures disclosed herein, it is not confined to the details set forth and this application is intended to cover such modifications or changes as may come within the purposes of the improvements or the scope of the following claims.

What is claimed is:

1. An irradiation control system comprising:
   a radiation energy source for producing radiation energy pulses to irradiate a surface;
   a proportion setting member, disposed in a portion of a path between said radiation energy source and the surface to be irradiated with the radiation energy pulses, for selectively setting a proportion of the radiation energy pulses of each pulse irradiating the surface, with respect to the radiation energy pulses produced by said source;
   actuating means for continuously changing the proportion setting of said proportion setting member during a period in which the surface is irradiated with a plurality of radiation energy pulses from said source; and
   control means for controlling said source in a timed relation with the operation of said actuating means so that a selected proportion is set by said proportion setting member to each radiation energy pulse produced by said source during the irradiation period.

2. A system according to claim 1, wherein said proportion setting member changes the proportion of the radiation energy pulses irradiating the surface, with respect to the radiation energy pulses produced by said radiation energy source, in accordance with at least one of the position and the attitude of said proportion setting member.

3. A system according to claim 1 wherein said radiation energy source comprises a pulsed light source and wherein said proportion setting member comprises a plurality of semi-transparent members having different transmission factors.

4. A system according to claim 1, wherein said radiation source comprises a pulsed light source and wherein said proportion setting member comprises an optical block having a plurality of semi-transparent surfaces with different transmission factors.

5. A system according to claim 1, wherein said radiation energy source comprises a pulsed light source and wherein said proportion setting member comprises a plurality of reflection surfaces having different reflection factors.

6. A system according to claim 1, wherein said radiation energy source comprises a pulsed light source and wherein said proportion setting member comprises an aperture stop which can be moved into and out of the path.

7. A system according to claim 1, wherein said radiation energy source comprises a pulsed light source and wherein said proportion setting member comprises an interference filter whose attitude is changeable in the path.

8. A system according to claim 1, further comprising a detector for detecting the quantity of radiation energy received by the surface.

9. A system according to claim 8, wherein said control means controls emission of radiation energy of a pulse produced by said source in response to a detection by said detector, so that said proportion setting member sets an appropriate proportion to that pulse.

10. An irradiation control method comprising the steps of:
    providing a proportion setting member in a portion of a path between a radiation energy pulse source for emitting radiation energy pulses and a surface to be irradiated with the radiation energy pulses emitted from the source;
    selectively setting a proportion of radiation energy for each pulse emanating from the proportion setting member, with respect to radiation energy of a respective pulse emitted from the source and received by the proportion setting member;
    continuously changing the proportion setting of the proportion setting member during a period in which the source emits a plurality of radiation energy pulses; and
    controlling pulse emission of the source in a timed relation with the changing of the proportion setting of the proportion setting member, so that a selected proportion is set to each radiation energy pulse emitted from the source during the period.

11. A semiconductor device manufacturing exposure method for exposing a wafer with laser beam pulses emitted from a laser, said method comprising the steps of:
    providing a proportion setting member in a portion of a path between the laser and the wafer, for selectively setting a proportion of radiation energy for each pulse emanating from the proportion setting member with respect to radiation energy of a respective pulse emitted from the source and received by the proportion setting member;
    continuously changing the proportion setting of the proportion setting member during a period in which the source emits a plurality of radiation energy pulses;
    controlling pulse emission of the source in a timed relation with the changing of the proportion setting of the proportion setting member, so that a selected proportion is set to each radiation energy pulse emitted from the source during the period;
    photoelectrically detecting each laser pulse emanating from the proportion setting member; and
    controlling the quantity of exposure of the wafer with laser beam pulses emitted from the laser, on the basis of the detection.

* * * * *

UNITED STATES PATENT AND TRADEMARK OFFICE
CERTIFICATE OF CORRECTION

PATENT NO. : 5,119,390

DATED : June 2, 1992

INVENTOR(S) : Taro Ohmori

It is certified that error appears in the above-identified patent and that said Letters Patent is hereby corrected as shown below:

ON THE COVER PAGE

IN THE ABSTRACT

Line 14, "from start" should read --from a start--.

COLUMN 4

Line 13, "selected amount." should read --selected.--;
Line 14, "selected" should read --selected amount--; and
Line 63, "th" should read --the--.

COLUMN 5

Line 12, "pulse pulses," should read --other pulses--.

COLUMN 6

Line 8, "fifteen-sixteenth" should read --fifteen-sixteenths--.

UNITED STATES PATENT AND TRADEMARK OFFICE
CERTIFICATE OF CORRECTION

PATENT NO. : 5,119,390
DATED : June 2, 1992
INVENTOR(S) : Taro Ohmori

It is certified that error appears in the above-identified patent and that said Letters Patent is hereby corrected as shown below:

COLUMN 7

Line 5, "in" should be deleted; and
    Line 32, "a" should read --as--.

COLUMN 8

Line 60, "means" should read --means,--.

COLUMN 9

Line 42, "a" should read --an--.

COLUMN 10

Line 35, "energize" should read --energizes--; and
    Line 40, "surface," should read --surfaces,--.

Signed and Sealed this

Thirty-first Day of August, 1993

Attest:

BRUCE LEHMAN

*Attesting Officer*     *Commissioner of Patents and Trademarks*